(12) United States Patent
Wu et al.

(10) Patent No.: US 8,361,237 B2
(45) Date of Patent: Jan. 29, 2013

(54) WET CLEAN COMPOSITIONS FOR COWP AND POROUS DIELECTRICS

(75) Inventors: Aiping Wu, Macungie, PA (US); Madhukar Bhaskara Rao, Fogelsville, PA (US); Eugene C. Baryschpolec, Breinigsville, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 12/624,970

(22) Filed: Nov. 24, 2009

(65) Prior Publication Data
US 2010/0152086 A1   Jun. 17, 2010

Related U.S. Application Data

(60) Provisional application No. 61/138,244, filed on Dec. 17, 2008.

(51) Int. Cl.
| | |
|---|---|
| *B08B 3/04* | (2006.01) |
| *C11D 7/26* | (2006.01) |
| *C11D 7/32* | (2006.01) |
| *C11D 7/50* | (2006.01) |

(52) U.S. Cl. .......... 134/1.2; 134/1.3; 510/175; 510/176; 510/245; 510/255; 510/258; 510/264; 510/265; 510/266; 510/477; 510/488; 510/499; 510/500; 510/505; 510/506

(58) Field of Classification Search .................. 510/175, 510/176, 245, 255, 258, 264, 265, 266, 477, 510/488, 499, 500, 504, 505, 506; 438/692; 134/1.2, 1.3
See application file for complete search history.

(56) References Cited

U.S. PATENT DOCUMENTS

| | | | |
|---|---|---|---|
| 6,174,812 B1 | 1/2001 | Hsiung et al. | |
| 6,372,050 B2* | 4/2002 | Honda et al. | 134/3 |
| 6,546,939 B1 | 4/2003 | Small | |
| 6,998,352 B2 | 2/2006 | Aoki et al. | |
| 7,736,405 B2* | 6/2010 | Darsillo et al. | 51/307 |
| 2003/0130146 A1 | 7/2003 | Egbe et al. | |
| 2004/0018949 A1* | 1/2004 | Lee | 510/175 |
| 2004/0108302 A1* | 6/2004 | Liu et al. | 216/83 |
| 2004/0229461 A1* | 11/2004 | Darsillo et al. | 438/689 |
| 2005/0106492 A1 | 5/2005 | Yokoi et al. | |

(Continued)

FOREIGN PATENT DOCUMENTS

| | | |
|---|---|---|
| CN | 101013679 A | 8/2007 |
| EP | 1 519 234 A2 | 3/2005 |

(Continued)

OTHER PUBLICATIONS

S. Chhun et al, Integration of multi-level self-aligned coWP barrier compatible with high performance BEOL, IEEE Jun. 2006, International Interconnect Technology Conference Proceedings, pp. 33-35.
D. Rebiscoul et al, Impact of plasma and diluted HF on a CoWP material, Solid State Phenomena vol. 134, Transtech Publications 2008, Zurick, Switzerland, pp. 321-324.
D. Rebiscoul et al, Study of the plasma and cleaning impact on a CoWPB material, ScienceDirect, Microelec. Engrg. 84, 2007, pp. 2455-2459.

(Continued)

*Primary Examiner* — Gregory Delcotto
(74) *Attorney, Agent, or Firm* — Geoffrey L. Chase; Anne B. Kiernan

(57) ABSTRACT

The present invention is a formulation for wet clean removal of post etch and ash residue from a semiconductor substrate having a CoWP feature, comprising;
  Deionized water;
  Organic acid;
  Amine and/or quaternary ammonium hydroxide;
wherein the formulation is compatible with the CoWP feature and either (a) the molar ratio of amine and/or quaternary ammonium hydroxide to organic acid provides a pH in the range of 7-14; or (b) the formulation includes a corrosion inhibitor.
A method of using the formulation is also described.

11 Claims, 5 Drawing Sheets

U.S. PATENT DOCUMENTS

| | | | |
|---|---|---|---|
| 2006/0118962 A1 | 6/2006 | Huang et al. | |
| 2006/0134911 A1 | 6/2006 | Restaino et al. | |
| 2006/0166847 A1* | 7/2006 | Walker et al. | 510/175 |
| 2006/0249482 A1* | 11/2006 | Wrschka et al. | 216/88 |
| 2006/0293208 A1* | 12/2006 | Egbe et al. | 510/407 |
| 2007/0057374 A1 | 3/2007 | McLaughlin et al. | |
| 2007/0087948 A1 | 4/2007 | Wu et al. | |
| 2007/0099806 A1 | 5/2007 | Stewart et al. | |
| 2007/0152341 A1 | 7/2007 | Hwang et al. | |
| 2007/0179072 A1* | 8/2007 | Rao et al. | 510/175 |
| 2007/0181852 A1* | 8/2007 | Liu et al. | 252/79.1 |
| 2007/0225186 A1 | 9/2007 | Fisher | |
| 2007/0231993 A1 | 10/2007 | Fukasawa et al. | |
| 2007/0287277 A1 | 12/2007 | Kolics et al. | |
| 2008/0076688 A1 | 3/2008 | Barnes et al. | |
| 2008/0226826 A1 | 9/2008 | Tanaka et al. | |
| 2008/0280437 A1 | 11/2008 | Tanaka et al. | |
| 2009/0162537 A1 | 6/2009 | Kolics et al. | |
| 2009/0203566 A1* | 8/2009 | Lee et al. | 510/175 |

FOREIGN PATENT DOCUMENTS

| | | |
|---|---|---|
| EP | 1519234 A2 | 3/2005 |
| EP | 2 098 911 A2 | 9/2009 |
| JP | 2004-302271 | 10/2004 |
| JP | 2007-107001 A2 | 4/2007 |
| JP | 2008103575 A2 | 5/2008 |
| WO | 0014190 A1 | 3/2000 |
| WO | 02/065538 A2 | 8/2002 |
| WO | 03/006598 A1 | 1/2003 |
| WO | 2006081406 A1 | 8/2006 |
| WO | 2006102318 A2 | 9/2006 |
| WO | 2008001697 A1 | 1/2008 |
| WO | 2008/080097 A2 | 7/2008 |
| WO | 2008078649 A1 | 7/2008 |
| WO | 2009/086231 A2 | 7/2009 |

OTHER PUBLICATIONS

M. Metikos-Hukovic, Passivation and corrosion behaviours of cobalt and cobalt-chromium-molybdenum alloy, ScienceDirect, Corrosion Science 49, 2007, pp. 3570-3579.

Jeff Lauerhaas, Reduced oxygen cleaning process for advanced Cu/Low-k integration, Sematech, Surface preparation and cleaning conference, Mar. 2009, pp. 3,7,11.

C.-K. Hu et al, Electromigration reliability in nanoscale Cu interconnects, Mat. Res. Soc. Symp. Proceedings 2008 (abstract).

Sergey Lopatin et al, Electroless Cu and barrier layers for sub-half micron multilevel interconnects, Proceedings of SPIE 1997, pp. 21-32 (abstract).

Laurin Dumas et al, Self-aligned barriers on Cu interconnections for CMOS image sensor technology, Adv. Metallization Conference Proceedings 2006, pp. 209-214 (abstract).

S. Lopatin et al, Mat. Res. Soc. Proceedings 1997, Electrochemical Syn. and Mod. of Mat., pp. 463-468 (abstract).

S. Lopatin et al, Integration of electroless Cu and CoWP multilayers in damascene process, Electrochem. Soc. 1997, Low and high dielectric constant materials: materials science, processing, and reliability issues, pp. 186-195 (abstract).

Yosi Shacham-Diamand et al, Material properties of electroless 100-200 nm thick CoWP films, Proceedings—Elec. Soc. 2000, Elec. Technology Appl. in Electronics, pp. 102-110 (abstract).

Yuji Segawa et al, Manufacturing-ready selectivity of CoWP capping on damascene copper interconnects, Adv. Metallization Conference 2001, pp. 567-572 (abstract).

C.-K. Hu et al, Effects of overlayers on electromigration reliability improvement for Cu/low K interconnects, IEEE Inter. Reliability Physics Symp. Proceedings 2004, 42nd, pp. 222-228 (abstract).

Ehrenfried Zschech et al, Challenges of electromigration, Materialpruefung 2004, 46,(10), pp. 513-516 (abstract).

Xinming Wang et al, Selective formation of CoWP capping barriers onto Cu interconnects by electroless plating, Adv. Metallization Conference Proceedings 2004, pp. 809-814 (abstract).

T. Ishigami et al, High reliability Cu interconnection utilizing a low contamination CoWP capping layer, Proceedings of IEEE Inter. Interconnect Technology Conference, 7th, Burlingame, CA, 2004, pp. 75-77 (abstract).

Peter Singer, The advantage of capping: copper with cobalt, Semiconductor Inter. 2005, 28(11) pp. 44-46 (abstract).

Anon, Use of a dielectric material with a low dielectric constant between copper strip conductors, IP.com Journal, 2005, 5(10A), p. 38 (abstract).

C.-K. Hu et al, Electromigration of Cu/low dielectric constant interconnects, Microelectronics Reliability 2005, vol. date 2006, 46(2-4) pp. 213-231 (abstract).

T. Kikkawa et al, Advanced scalable ultralow-k/Cu interconnect technology for 32 nm CMOS ULSI using self-assembled porous silica and self-aligned CoWP barrier, IEEE, Technical Digest—Inter. Electron Devices Meeting 2005, pp. 99-102 (abstract).

T. Decorps et al, Electroless deposition of CoWP Material characterization and process optimization on 300 mm wafers, Microelectronics Engrg. 2006, 83(11-12), pp. 2082-2087 (abstract).

Peter Singer, Copper/low-k challenges for 45 and 32 nm, Semiconductor Inter. 2006, 29(12), p. 32 (abstract).

J. Gambino et al, IEEE Inter. Interconnect Technology Conference Proceedings, Burlingame CA, Jun. 2006, pp. 30-32 (abstract).

N. Kawahara et al, A novel CoWP cap integration for porous low-k/Cu interconnects with NH3 plasma treatment and low-k top (LKT) dielectric structure, IEEE Inter. Interconnect Technology conference Proceedings Burlingame CA, Jun. 2006, pp. 152-154 (abstract).

Kazuyoshi Ueno et al, Reliability of damascene copper interconnects, Proceedings, Electrochem. Soc. 2005, ULSI Process Integration IV, pp. 408-418 (abstract).

Takashi Ishigami et al, Electroless CoWP capping for Cu/low-k integration, Adv. Metallization Conference 2006, Proceedings, Japan and US, 2006, pp. 171-176 (abstract).

Takenobu Yoshino et al, CoWP as a draft barrier for Cu ions studied by electric measurements, J. of Elec. Soc. 2007, 154(8), pp. H672-H674 (abstract).

James Pan et al, Novel approach to reduce source/drain series and contact resistance in high-performance UTSOI CMOS devices using selective electrodeless CoWP or CoB process, IEEE Electron Device Letters 2007, 28(8), pp. 691-693 (abstract).

J. Guillan et al, Hybrid punch through approach to address electroless related integration issues of hybrid CoWP/SiCN barriers, Microelectronic Engineering 2007, 84(11), pp. 2629-2633 (abstract).

T. Tsai et al, Electroless CoWP as a diffusion barrier between electroless copper and silicon, J. Elec. Mat. 2007, 36 (11), pp. 1408-1414 (abstract).

Moritz Andreas Meyer et al, New microstructure-related EM degradation and failure mechanisms in Cu interconnects with CoWP coating, AIP Conference Proceedings 2007, pp. 107-114 (abstract).

D. Rebiscoul et al, Impact of plasma and diluted HF on a CoWP material, Diffusion and Defect Data—Solid State Data, Pt. B: Solid State Phenomena 2008, 134, pp. 321-324 (abstract).

S. Dulal et al, Electrodeposition of CoWP film, Applied Surface Science 2009, 255(11), pp. 5795-5801 (abstract).

Anon. Methods to electrochemically fill contact vias with alternative materials to replace CVD tungsten for lower contact resistance, IP.com Journal 2008, pp. 15-16 (abstract).

A. Abdel Aal et al, Synthesis and characterization of electroless deposited Co-W-P thin films as diffusion barrier layer, Surface and Coatings Technology 2008, 202(19), pp. 4591-4597 (abstract).

Rakefet Ofek Almog et al, A surface adsorption limited model of CoWBP capping barriers for sub 45-nm Cu interconnects, Adv. Metallization Conference 2007, Proceedings, Japan and New York 2007, pp. 11-16 (abstract).

Julie Guilan et al, Hybrid CoWP/SiCN barriers integration using hybrid punch through approach, Adv. Metallization Conference 2007, Proceedings, Tokyo and New York 2007, pp. 17-22 (abstract).

C.-K. Hu et al, Electromigration reliability in nanoscale Cu interconnects, Mat. Research Soc. Symp. Proceedings 2008, vol. Date 2007, 1036E (abstract).

* cited by examiner

WET CLEAN COMPOSITIONS FOR COWP AND POROUS DIELECTRICS

CROSS-REFERENCE TO RELATED APPLICATIONS

The present application claims the benefit of U.S. Provisional Patent Application Ser. No. 61/138,244 filed Dec. 17, 2008.

BACKGROUND OF THE INVENTION

One of the many challenges faced during continuous scaling of integrated circuits (ICs) is to achieve acceptable electromigration (EM) reliability for Cu interconnects. One way to address this challenge is the deposit of a metallic capping layer on Cu upper interface. The electroless deposition of cobalt tungsten phosphide (CoWP) appears to be the most promising candidate as a capping layer for Cu metallization.

The successful implementation of CoWP depends, not only on an optimized deposition, but also on a complete CoWP compatible integration processing, which includes wet clean processing. However, the common semi-aqueous fluoride strippers and diluted hydrofluoric acid (DHF) strippers are incompatible with CoWP, which completely remove the CoWP layer during the wet clean process.

See J. Lauerhaas, Reduced Oxygen Cleaning Process for Advanced Cu/Low-k Integration, SEMATECH Surface Preparation and Cleaning Conference, Mar. 23-25, 2009.

The present invention discloses wet clean formulations which demonstrate proficient cleaning on CoWP exposed patterned wafers, while maintaining CoWP integrity, as will be disclosed more fully below.

BRIEF SUMMARY OF THE INVENTION

The present invention is a wet clean formulation for removal of post etch and ash residue from a semiconductor substrate having a CoWP feature, comprising:

Deionized water;

Organic acid;

Amine and/or quaternary ammonium hydroxide;

wherein the formulation is compatible with the CoWP feature and either (a) the molar ratio of amine and/or quaternary ammonium hydroxide to organic acid provides a pH in the range of 7-14; or (b) the formulation includes a corrosion inhibitor.

The present invention is also a process for wet clean removal of post etch and ash residue from a semiconductor substrate having a CoWP feature, comprising:

Providing a semiconductor substrate having a CoWP feature;

Contacting the substrate with a formulation comprising

Deionized water;

Organic acid;

Amine and/or quaternary ammonium hydroxide;

wherein the formulation is compatible with the CoWP feature and either (a) the molar ratio of amine and/or quaternary ammonium hydroxide to organic acid provides a pH in the range of 7-14; or (b) the formulation includes a corrosion inhibitor.

DETAILED DESCRIPTION OF THE INVENTION

Figure 1:
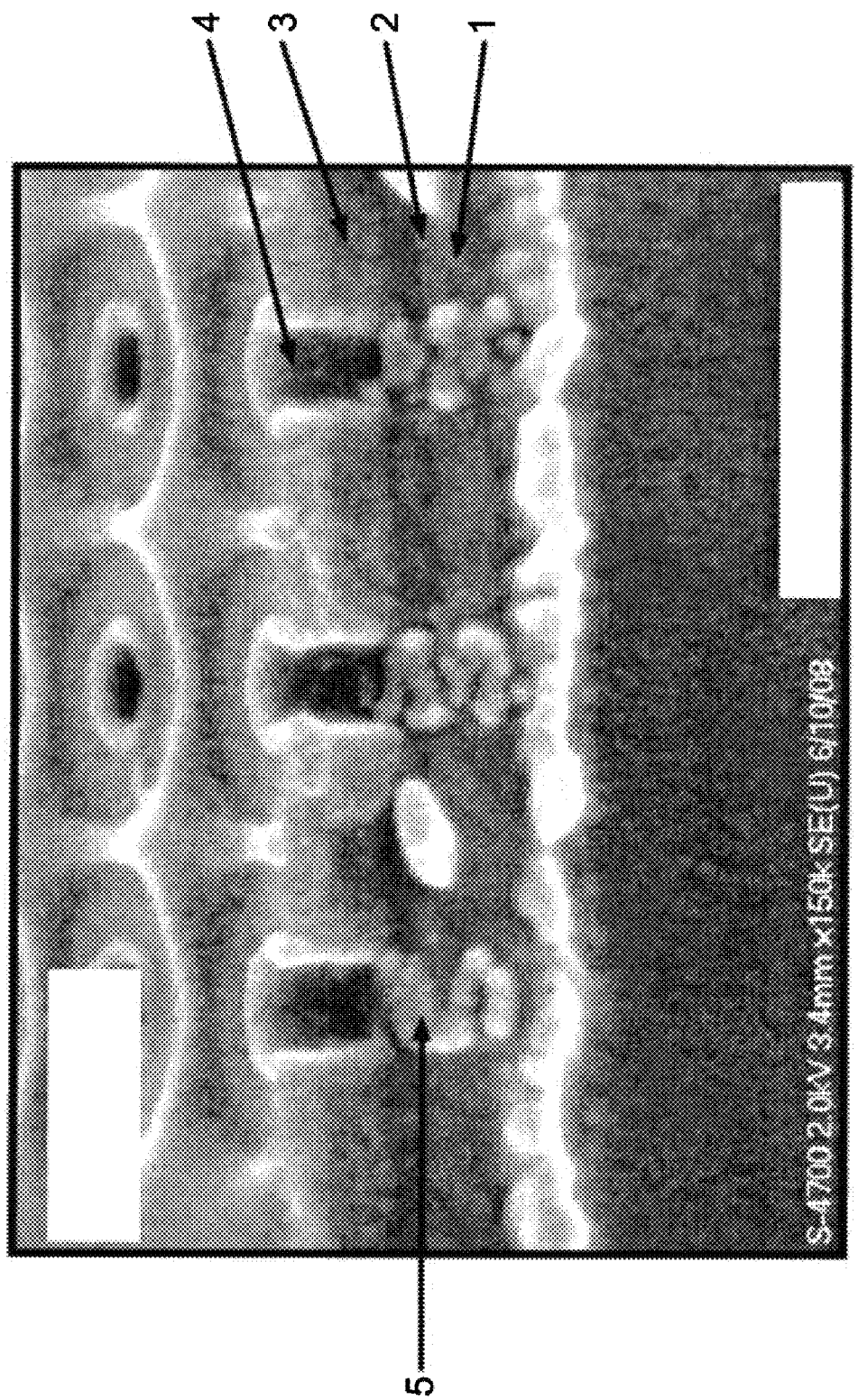
FIG. 1 is a scanning electron micrograph (SEM) of a patterned wafer having a CoWP capping layer before any cleaning chemicals are contacted. 1 is copper layer, 2 is CoWP capping layer, 3 is ILD layer, 4 is via hole and 5 indicates post etch/ash residues.
Figure 2:
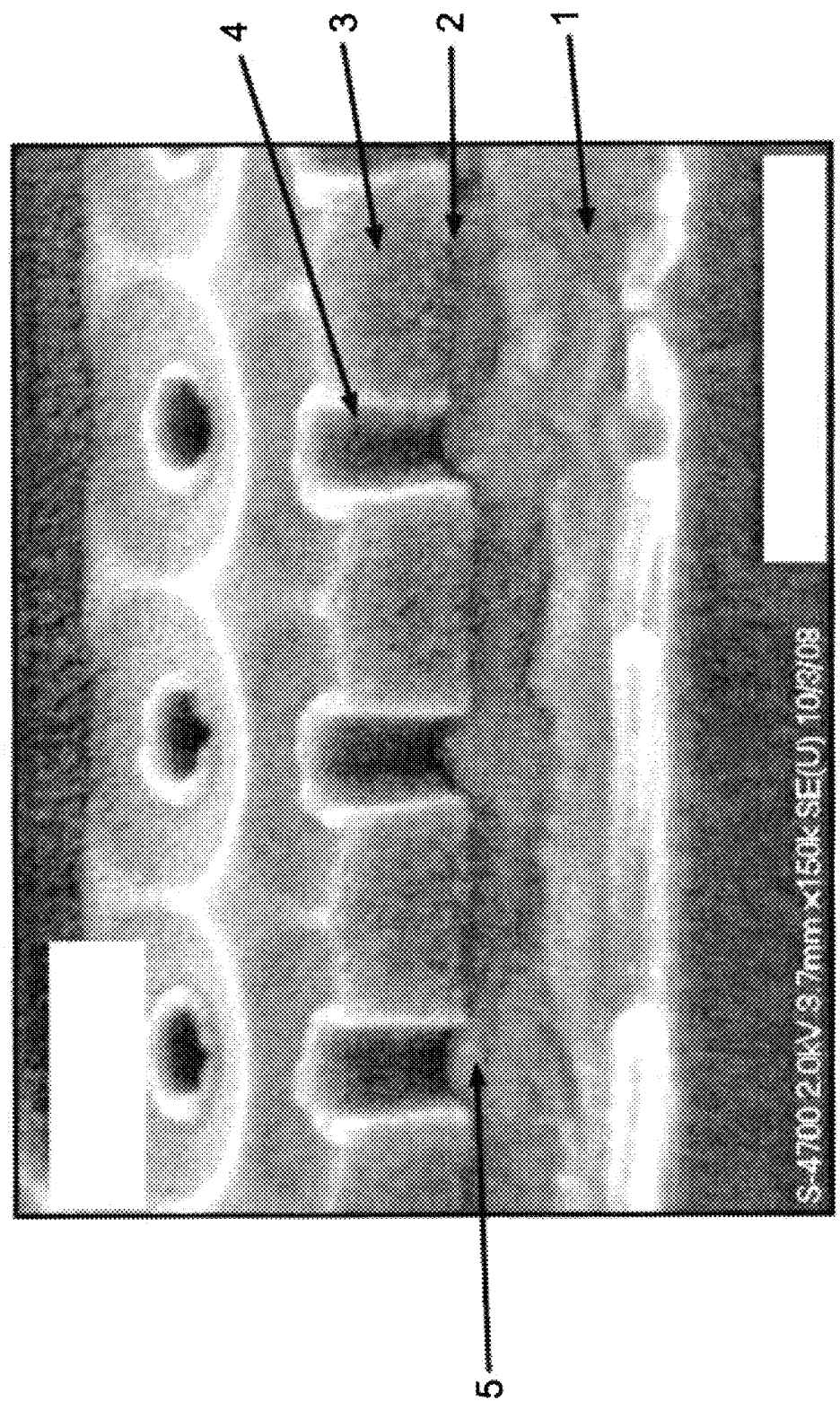
FIG. 2 is a SEM of a patterned wafer having a CoWP capping layer after cleaning with a formulation of the present invention comprising Ex. 2 AW21028-85G at 25° C. and 2 minutes of contact. 1 is copper layer, 2 is CoWP capping layer, 3 is ILD layer, 4 is via hole and 5 indicates post etch/ash residues.
Figure 3:
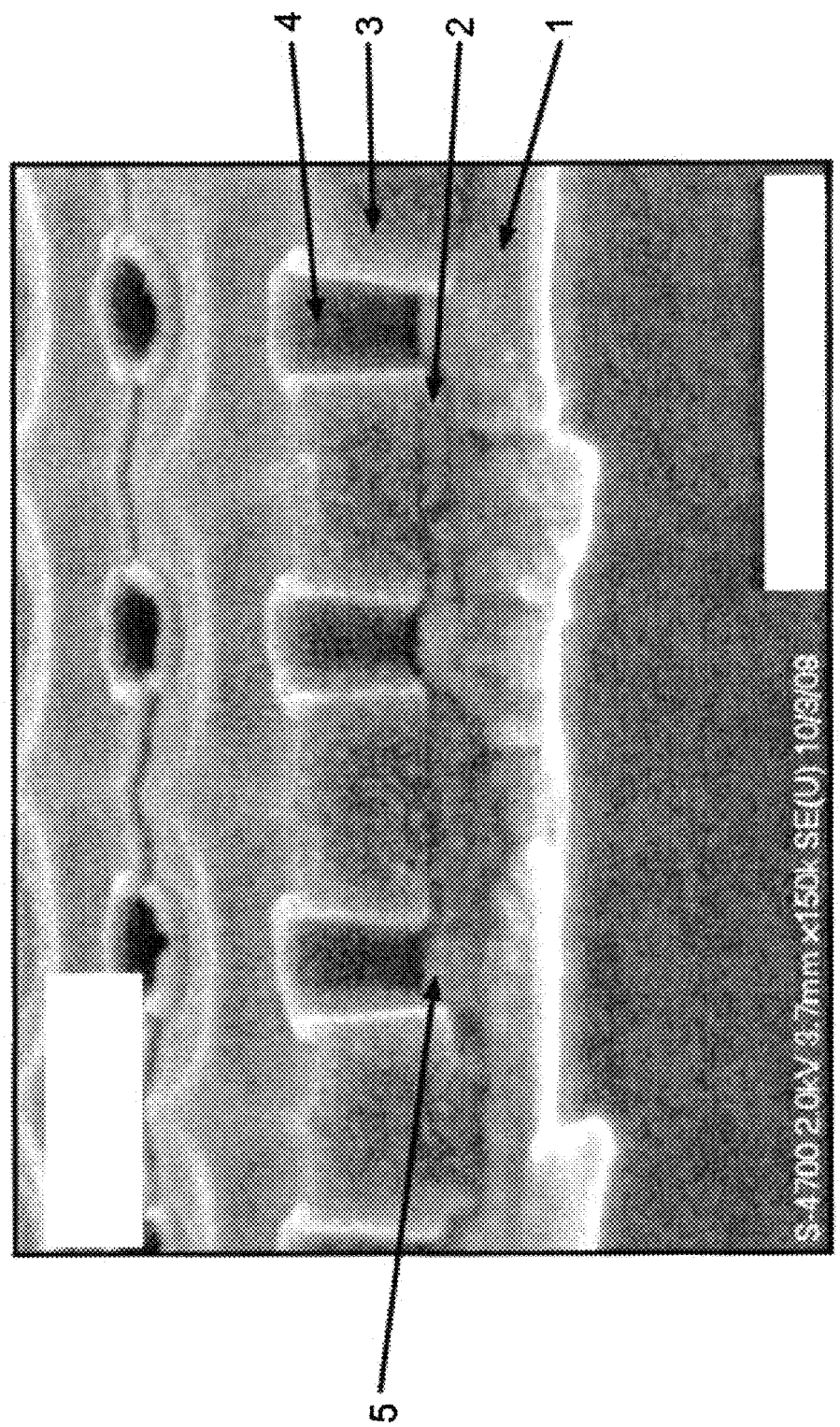
FIG. 3 is a SEM of a patterned wafer having a CoWP capping layer after cleaning with a formulation of the present invention comprising Ex. 3 AW21028-85H at 25° C. and 2 minutes of contact. 1 is copper layer, 2 is CoWP capping layer, 3 is ILD layer, 4 is via hole and 5 indicates post etch/ash residues.
Figure 4:
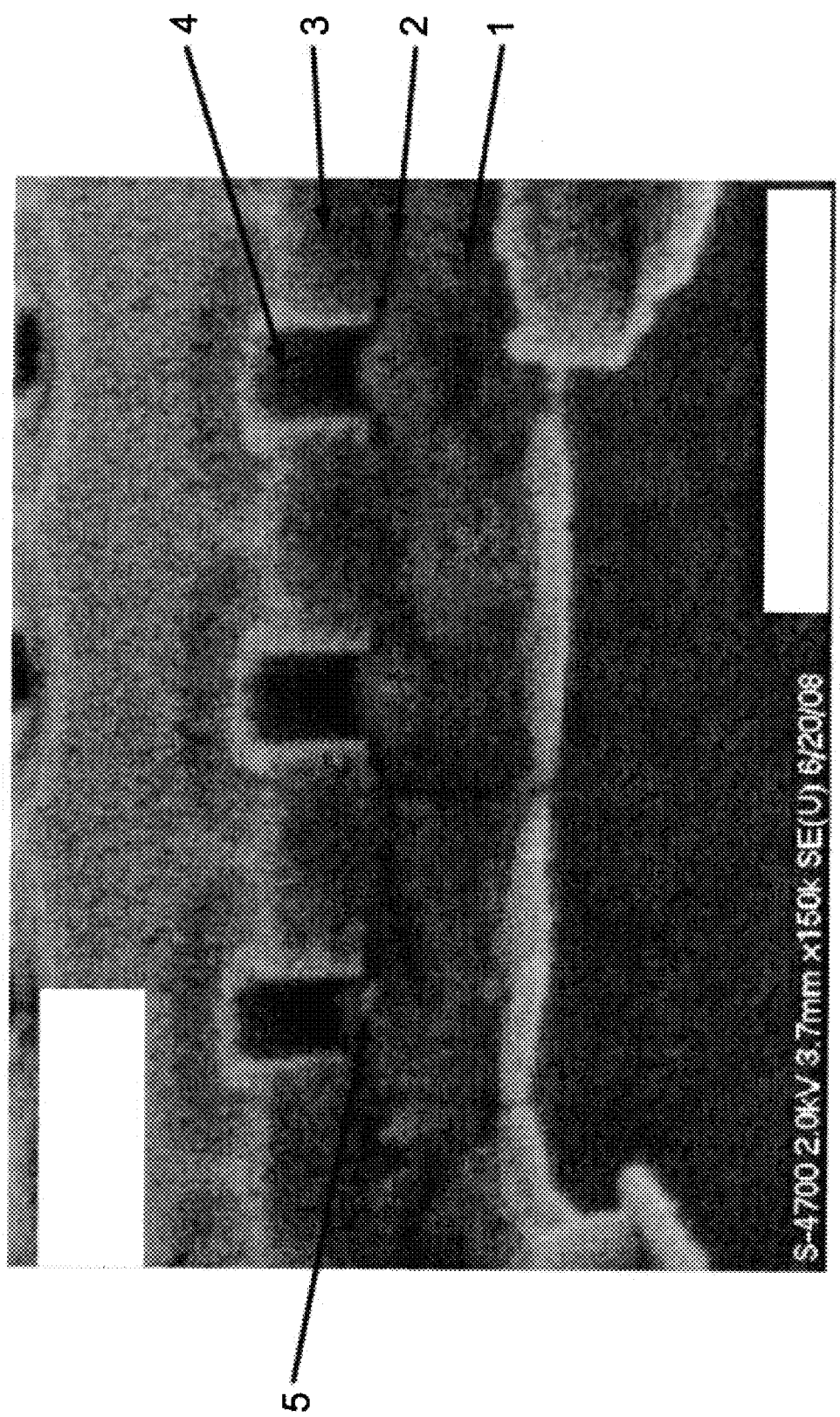
FIG. 4 is a SEM of a patterned wafer having a CoWP capping layer after cleaning with a formulation of the present invention comprising Ex. 6 AW21028-67E at 25° C. and 2 minutes of contact. 1 is copper layer, 2 is CoWP capping layer, 3 is ILD layer, 4 is via hole and 5 indicates post etch/ash residues.
Figure 5:
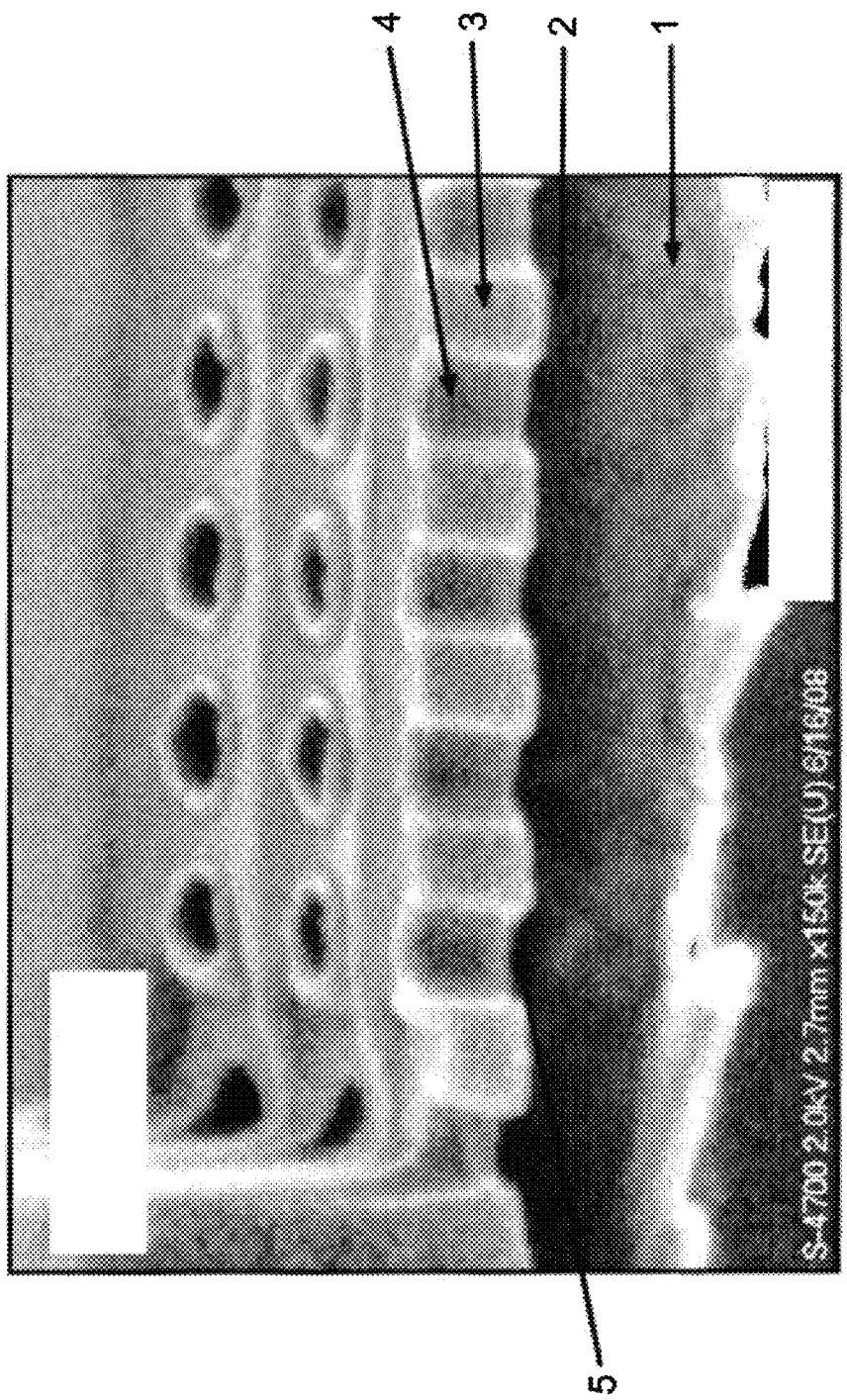
FIG. 5 is a SEM of a patterned wafer having a CoWP capping layer after cleaning with a formulation of the comparative art comprising Comp. Ex. 2 DHF (800:1) at 25° C. and 30 seconds of contact. 1 is copper layer, 2 is CoWP capping layer, 3 is ILD layer, 4 is via hole and 5 indicates post etch/ash residues.

The common semi-aqueous fluoride strippers and DHF strippers have high CoWP etch rate and severe CoWP/Cu galvanic corrosion. In contrast, the present invention discloses wet clean formulations, which effectively minimize CoWP etch and CoWP/Cu galvanic corrosion (collectively CoWP compatible), demonstrate proficient cleaning on Cu/low-k patterned wafer with and without CoWP feature and have minimal impact to porous low-k dielectrics. Preferably, the CoWP compatibility represents a CoWP etch rate no greater than 2.5 Å/min.

This invention discloses non-fluoride wet cleaning formulations suitable for post etch and ash residue cleaning in IC integration processes, especially for CoWP intergrated processes. The formulations comprise deionized water (DIW), organic acid and/or the salt thereof, amine and/or quaternary ammonium hydroxide and solvent. The pH of the composition is 7-14, preferably 7-11. Alternately, lower pH can be used if a corrosion inhibitor is present.

By controlling the formulation pH, solvent and solvent/water ratio, the CoWP etch rate and CoWP/Cu galvanic corrosion can be minimized.

The compositions can be mixed by adding sequentially: DIW, organic acid, amine and/or quaternary ammonium hydroxide, and solvent at room temperature. The salt of organic acid and amine and/or quaternary ammonium hydroxide can be formed in-situ. The molar ratio of amine and/or quaternary ammonium hydroxide to organic acid is equal or greater than 1 or sufficient to maintain a pH of 7-14.

Examples of the compositions are:

EX. 1

AW21028-83H

| | |
|---|---|
| DI water | 46.36 wt % |
| Acetic acid | 0.84 wt % |
| TEA | 2.8 wt % |
| Glycerol | 50 wt % |

(TEA = triethanolamine)

EX. 2

AW21028-85G

| | |
|---|---|
| DI water | 55.45 wt % |
| Acetic acid | 1.05 wt % |
| TEA | 3.5 wt % |
| Glycerol | 40 wt % |

EX. 3

AW21028-85H

| | |
|---|---|
| DI water | 57.27 wt % |
| Acetic acid | 0.63 wt % |
| TEA | 2.1 wt % |
| Glycerol | 40 wt % |

EX. 4

AW21028-90A

| | |
|---|---|
| DI water | 47.86 wt % |
| Acetic acid | 0.84 wt % |
| NMEA | 1.3 wt % |
| Glycerol | 50 wt % |

(NMEA = N-methyl monoethanol amine)

EX. 5

AW21028-66F

| | |
|---|---|
| DI water | 96.69 wt % |
| Acetic acid | 0.42 wt % |
| TMAH (25%) | 3.16 wt % |

(TMAH (25%) = tetramethylammonium hydroxide, 25% aqueous solution)

EX. 6

AW21028-67E

| | |
|---|---|
| DI water | 65.41 wt % |
| Octanoic acid | 2 wt % |
| TEA | 2.59 wt % |
| Glycerol | 30 wt % |

EX. 7

AW21656-29G

| | |
|---|---|
| DI water | 55.93 wt % |
| Ascorbic acid | 2.52 wt % |
| TEA | 1.55 wt % |
| Glycerol | 40 wt % |

EX. 8

AW21656-29H

| | |
|---|---|
| DI water | 54.89 wt % |
| Ascorbic acid | 2.52 wt % |
| TEA | 2.59 wt % |
| Glycerol | 40 wt % |

EX. 9

AW21656-29F

| | |
|---|---|
| DI water | 53.98 wt % |
| Ascorbic acid | 2.52 wt % |
| TEA | 3.50 wt % |
| Glycerol | 40 wt % |

Preferred Ranges:

| | |
|---|---|
| DI water | 7-99.7 wt % |
| Organic acid | 0.2-5 wt % |
| Amine/quaternary ammonium hydroxide | 0.5-20 wt % |
| Solvent | 0-70 wt % |

Most Preferred Ranges:

| | |
|---|---|
| DI water | 7-99.7 wt % |
| Organic acid | 0.5-3 wt % |
| Amine/quaternary ammonium hydroxide | 1.5-10 wt % |
| Solvent | 25-55 wt % |

Exemplary Organic Acids:

Examples of organic acids may be aliphatic/aromatic carboxylic acids, amino carboxylic acid, sulfonic acids and aminosulfonic acid. Exemplary carboxylic acids include, but are not limited to, acetic acid, propionic acid, butyric acid, pentanoic acid, 3-methylbutanoic acid, hexanoic acid, heptanoic acid, octanoic acid, nonanoic acid, decanoic acid, dodecanoic acid, tridecanoic acid, tetradecanoic acid, pentadecanoic acid, hexadecanoic acid, heptadecanoic acid, octadecanoic acid, dodecanedioic acid, 2-methylheptanoic acid, 2-hexyldecanoic acid, oxalic acid, malonic acid, maleic acid, fumaric acid, succinic acid, itaconic acid, glutaric acid, adipic acid, malic acid, tartaric acid, acrylic acid, methacrylic acid, citric acid, lactic acid, glycolic acid, ascorbic acid, anthranilic acid, gallic acid, benzoic acid, isophthalic acid, phthalic acid, trimellitic acid, pyromellitic acid, salicylic acid, 2,4-dihydroxy benzoic acid and others. Exemplary amino carboxylic acids include, but are not limited to, glycine, dihydroxy ethyl glycine, alanine, valine, leucine, asparagine, glutamine, aspartic acid, glutaric acid, lysine, arginine, imino diacetic acid, nitrilo triacetic acid, ethylenediamine tetraacetic acid, 1,2-cyclohexadiamine tetraacetic acid, diethylene triamine pentaacetic acid, and others. Exemplary sulfonic/aminosulfonic acids include, but are not limited to, benzyl sulfonic acid, p-toluene sulfonic acid, 2-(N-morpholino)ethanesulfonic acid, N-(2-hydroxyethyl)piperazine-N'-(ethanesulfonic acid), 3-[N,N-bis(2-hydroxyethyl)amino]-2-hydroxypropanesulfonic acid, 4-(N-morpholino)butanesulfonic acid, N-(2-hydroxyethyl)piperazine-N'-(2-hydroxypropanesulfonic acid), N-(2-hydroxyethyl)piperazine-N'-(3-propanesulfonic acid), 2-(N-cyclohexylamino)ethanesulfonic acid, and others.

Exemplary Amines:

Examples of amines may be aliphatic/aromatic primary, secondary, tertiary amines, diamines and triamines, alkanolamines, alicyclic amines, heterocyclic amines and hydroxylamines. Examples of amines includes methylamine, ethylamine, propylamine, butylamine, monoethanolamine, monoisopropanolamine, 2-(2-aminoethoxy)ethanol, dimethylamine, diethylamine, dipropylamine, dibutylamine, diethanolamine, N-methyl ethanolamine, N-ethyl ethanolamine, trimethylamine, triethylamine, tripropylamine, tributylamine, N,N-dimethylethanolamine, N,N-diethyl ethanolamine, N-methyl diethanolamine, N-ethyl diethanolamine, triethanolamine, cyclohexylamine, dicyclohexylamine, pyrrole, pyrrolidine, pyridine, morpholine, pyrazine, piperidine, benzylamine, dibenzylamine, N-methyl benzylamine, N-ethyl benzylamine and others. Examples of hydroxylamines that may be used in the cleaning composition described herein include; hydroxylamine or alkyl-substituted derivates of hydroxylamine, such as, without limitation, hydroxylamine, N-methyl hydroxylamine, N,N-dimethyl hydroxylamine, N,N-diethyl hydroxylamine and others.

Exemplary Quaternary Ammonium Hydroxides:

Examples of quaternary ammonium hydroxides may be those compounds having the formula: $[N-R_1R_2R_3R_4]^+OH^-$, wherein $R_1$, $R_2$, $R_3$, and $R_4$ are each independently an alkyl group, a hydroxyalkyl group, and combinations thereof. The term "alkyl" as used herein refers to straight or branched chain unsubstituted hydrocarbon groups of 1 to 20 carbon atoms, or preferably from 1 to 8 carbon atoms, or more preferably from 1 to 4 carbon atoms.

Examples of suitable alkyl groups include; methyl, ethyl, propyl, isopropyl, butyl, isobutyl and tertbutyl.

The term "hydroxyalkyl" as used herein refers to straight or branched unsubstituted hydroxylalkyl groups containing hydrocarbon groups of from 1 to 20 carbon atoms, or preferably from 1 to 8 carbon atoms, or more preferably from 1 to 4 carbon atoms.

Examples of suitable hydroxylalkyl groups include hydroxylethyl and hydroxypropyl.

Examples of suitable quaternary ammonium hydroxide compounds include; tetramethylammounium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide and benzyltrimethylammonium hydroxide.

Exemplary Solvents:

The formulations disclosed herein may contain at least one organic polar solvent, that is preferably water-soluble. Examples of organic polar solvents may be amides and sulfoxides. Examples of organic polar solvents include, but are not limited to, dimethylacetamide (DMAC), N-methylpyrrolidinone (NMP), dimethylsulfoxide (DMSO), tetramethylene sulfone, dimethylformamide, N-methylformamide, formamide, dimethyl-2-piperidone (DMPD) and other amides, alcohols or sulfoxides, or multifunctional compounds, such as hydroxyamides or amino alcohols.

Further examples of the organic polar solvent include diols and polyols such as ($C_2$-$C_{20}$) alkanediols and ($C_3$-$C_{20}$) alkanetriols, cyclic alcohols and substituted alcohols. Particular examples of these organic solvents are ethylene glycol, propylene glycol, glycerol, tetrahydrofurfuryl alcohol, diacetone alcohol and 1,4-cyclohexanedimethanol.

The non-aqueous solvents enumerated above may be used alone or in combination with two or more solvents.

In certain embodiments, the organic polar solvent may comprise a glycol ether. Examples of glycol ethers include ethylene glycol monomethyl ether, ethylene glycol monoethyl ether, ethylene glycol monobutyl ether, ethylene glycol monophenyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol monomethyl ether acetate, ethylene glycol monethyl ether acetate, propylene glycol methyl ether acetate, propylene glycol monomethyl ether, propylene glycol dimethyl ether, propylene glycol monobutyl ether, propylene glycol monopropyl ether, dipropylene glycol monomethyl ether, dipropylene glycol monopropyl ether, dipropylene glycol monoisopropyl ether, dipropylene glycol monobutyl ether, diproplylene glycol diisopropyl ether, tripropylene glycol monomethyl ether, 1-methoxy-2-butanol, 2-methoxy-1-butanol, 2-methoxy-2-methylbutanol and 2-(2-butoxyethoxy)ethanol.

COMPARATIVE EXAMPLES

Comparative Ex. 1

DHF (100:1)

| DI water | 99 wt % |
|---|---|
| HF(49%) | 1 wt % |

Comparative Ex. 2

DHF (800:1)

| DI water | 799 wt % |
|---|---|
| HF(49%) | 1 wt % |

The summary of etch rates ("ER") of Co, CoWP and Cu are provided in Table 1 and 2. In determining the Co and Cu etch rate, the wafers had a blanket layer of a known thickness deposited upon it. The initial thickness of the wafer was determined using the CDE ResMap 273 Four Point Probe. After determining the initial thickness, test wafers were immersed in the wet clean formulations. After five minutes, the test wafers were removed from the wet clean formulation, rinsed for three minutes with deionized water and completely dried under nitrogen. The thickness of each wafer was measured. The procedure was repeated at 10, 20, 40, and 60 minutes of exposure. Thickness measurements were determined at each time interval and graphed using a "least squares fit" model on the results for each clean formulation. The calculated slope of the "least squares fit" model of each composition is the resultant etch rate provided in angstroms/minute (Å/min). In determining the CoWP etch rate, the film thickness could not easily be measured by conventional ellipsometric methods, because the CoWP films were very thin and the underlying Cu causes reflection of the incident beam. As an alternative, the open circuit potential (OCP) of the CoWP layer was measured as a function of time of immersion in the wet clean formulation. A blanket CoWP substrate (1×4 $cm^2$) was immersed in the 500 ml air-saturated wet clean formulations and the potential was monitored over time. The OCP of CoWP film is significantly different from underlying Cu. At the point where the CoWP is completely etched, the open circuit potential is similar to Cu. By noting the time it takes to reach the Cu OCP and knowing the starting thickness of CoWP layer, the CoWP etch rate can be determined. In determining the galvanic current of CoWP and Cu couple, the potential polarization was carried out to determine the corrosion current of CoWP in a galvanic couple with Cu when in contact with the various wet clean formulations. The blanket CoWP or Cu substrate (2×2 $cm^2$) was immersed in 500 ml of wet clean formulation at ambient temperature under air-saturated conditions with strong agitation (600 RPM). Cathodic current was then applied from −1 V to 0.1 V at a scan rate of 10 mV/s with respect to the Ag/AgCl reference electrode. The polarization curves are plotted as Tafel plots. Extrapolation to zero current density gives the corrosion potential (Ecorr). The current density at the cross point of CoWP and Cu polarization curves gives galvanic current density of the CoWP and Cu couple.

Table 1 shows that the wet clean formulations of present invention have lower etch rates on Co, CoWP and Cu and lower galvanic current density compared to Comp. Ex. 1 DHF (100:1). Table 1 and Table 2 show that all wet clean formulations of the present invention have superior low etch rate on CoWP, which is essential for CoWP integration.

TABLE 1

CoWP Compatibility data on blanket CoWP wafers and Co and Cu etch rates

| Clean Formulations | pH | Co etch rate (Å/min) | CoWP etch rate (Å/min) | Cu etch rate (Å/min) | Galvanic current density (A/$cm^2$) |
|---|---|---|---|---|---|
| Comp. Ex. 1 DHF (100:1) | NA | 109 | 14 | 7 | 2.2E−04 |
| Ex. 1 AW21028-83H | 7.33 | 13 | 1.5 | 2 | 3.25E−05 |
| Ex. 2 AW21028-85G | 7.40 | 13 | 2 | 2 | 4.5E−05 |
| Ex. 3 AW21028-85H | 7.32 | 13 | 2 | 1 | 6E−05 |
| Ex. 4 AW21-28-90A | 9.25 | 2 | <1 | 4 | 4.5E−07 |
| Ex. 5 AW21028-66F | 10.93 | 3 | 1.5 | 1 | 2.2E−05 |
| Ex. 6 AW21028-67E | 7.23 | 9 | <1 | 1 | 3.25E−06 |

NA: not available
pH determinations were made using 5% aqueous solutions at ambient temperature.

TABLE 2

Etch rate data on blanket Co, CoWP and Cu wafers

| Clean Formulations | pH | Co etch rate (Å/min) | CoWP etch rate (Å/min) | Cu etch rate (Å/min) |
|---|---|---|---|---|
| Ex. 7 AW21656-29G | 4.96 | 10 | 1.7 | 2 |
| Ex. 8 AW21656-29H | 7.13 | 5 | 1 | 1 |
| Ex. 9 AW21656-29F | 7.66 | 33 | <1 | <1 |

The summary of cleaning data, along with the exposure temperature and time, are provided in Table 3. The test wafers are post etch and ash patterned wafers featuring trenches and vias in a Cu/CoWP/ILD stack. In this procedure, one or more test wafers were placed in a 600 milliliter (ml) beaker that contained 400 ml of each wet clean formulation. The 600 ml beaker further included a 1" stir bar that rotated at 400 revolutions per minute. The wet clean formulations having the wafer(s) contained therein were then heated at the time and temperature provided in Table 3. After exposure to the wet clean formulation, the wafer(s) were rinsed with deionized water and dried with nitrogen gas. The wafers were cleaved to provide an edge, then examined using scanning electron microscopy (SEM) on a variety of pre-determined locations on the wafer and the results were visually interpreted for cleaning performance and CoWP compatibility. Table 3 shows Comp. Ex. 2 DHF (800:1) completely cleans the residue and removes the CoWP layer at 25° C./30 second. This clearly demonstrates that DHF is incompatible to CoWP capping layer. The wet clean formulations of the present invention, comprising, in this instance: Ex. 2 AW21028-85G and Ex. 6 AW21028-67E completely clean residues without undercutting the CoWP layer at 25° C./2 min. These results demonstrate good cleaning efficiency and CoWP compatibility of the wet clean formulations of the present invention.

TABLE 3

Cleaning performance of patterned CoWP wafers

| Clean Formulations | Temp. (° C.) | Time (min) | CoWP patterned wafer Cleaning performance | CoWP compatibility |
|---|---|---|---|---|
| Comp. Ex. 2 DHF (800:1) | 25 | 0.5 | no residue | CoWP removed |
| Ex. 1 AW21028-83H | 25 | 2 | slight residue | slight undercut |
| Ex. 2 AW21028-85G | 25 | 2 | no residue | no undercut |
| Ex. 3 AW21028-85H | 25 | 2 | no residue | slight undercut |
| Ex. 4 AW21028-90A | 25 | 2 | some residue | no undercut |
| Ex. 5 AW21028-66F | 25 | 2 | slight residue | slight undercut |
| Ex. 6 AW21028-67E | 25 | 2 | no residue | no undercut |

The summary of blanket porous ILD compatibility data are provided in Table 4 and 5. Diethoxymethylsilane (DEMS) based porous organosilicate glass (OSG) films were deposited using a Precision 5000 integrated deposition platform. DEMS and a porogen were used as the chemical precursors to deposit the composite film onto <100> Si 8-12 ohm/cm 200 mm wafers. The films were UV-cured to prepare the final porous film having a dielectric constant of 2.5. The thickness and refractive index of the dielectrics film were determined using SCl FilmTek™ 2000 Reflectometer. The k value and FTIR (Fourier Transform Infrared Spectroscopy) spectra were obtained using MSI electronics Mercury probe (Model Hg-401) and NEXUS 470 FT-IR spectroscopy, respectively.

Table 4 summarizes dielectric compatibility of wet clean formulations of the present invention with DEMS-based porous OSG (k=2.5). The pristine ILD wafer with a k value of 2.5 was processed in wet clean formulations: Ex. 1 AW21028-83H, Ex. 2 AW21028-85G and Ex. 3 AW21028-85H at 25° C. for 2 minutes. There were no changes in film thickness, refractive index or k value after processing. FTIR data in Table 5 show that the bond retention of C—H/SiO$_2$ and Si—CH$_3$/SiO$_2$ are almost constant, indicating no damage to surface Si—CH$_3$ bond and SiO$_2$ network. These results indicate the wet clean formulations of the present invention have no negative impact on blanket porous ILD dielectrics.

TABLE 4

Blanket porous ILD PDEMS 2.5 compatibility

| Clean Formulations | Temp. (° C.) | Time (min) | etch rate (Å/min) | Change of refractive index | Change of k |
|---|---|---|---|---|---|
| Ex. 1 AW21028-83H | 25 | 2 | <1 | 0 | 0.02 |
| Ex. 2 AW21028-85G | 25 | 2 | <1 | 0.001 | 0 |
| Ex. 3 AW21028-85H | 25 | 2 | <1 | 0.001 | 0 |

TABLE 5

Blanket porous ILD PDEMS 2.5 compatibility: FTIR

| Clean Formulations | Temp. (° C.) | Time (min) | Before Si—CH3/SiO | Before C—H/SiO | After Si—CH3/SiO | After C—H/SiO |
|---|---|---|---|---|---|---|
| Ex. 2 AW21028-85G | 25 | 2 | 0.020 | 0.015 | 0.021 | 0.014 |
|  | 30 | 2 | 0.020 | 0.015 | 0.021 | 0.013 |
|  | 35 | 2 | 0.020 | 0.014 | 0.020 | 0.013 |
| Ex. 3 AW21028-85H | 25 | 2 | 0.021 | 0.014 | 0.021 | 0.014 |

Patterned trench features on porous OSG dielectrics were used to determine the effect of the wet clean formulations on etch-damaged dielectric sidewall. The patterned wafers were prepared based upon 90 nm design rules. During the patterned wafer process, a photoresist layer is coated on the substrate with porous OSG dielectrics. Using a photolithographic process, a pattern is defined on the photoresist layer. The patterned photoresist layer is then subjected to plasma etch, by which the pattern is transferred to the substrate. The patterned substrate is subsequently etched and ashed to form the desired trench features. The CD (critical demention) changes of dielectrics trench (M1 trench), after treatment with the wet clean formulations, were measured by SEM and provided in Table 6.

Table 6 demonstrates minimal change of CD (0.03 µm, 3%) after processing in the wet clean formulation of the present invention, comprising: Ex. 2 AW21028-8G at 25° C. for 2 minutes. By contrast, a severe CD shift was observed (0.21 µm, 21%) after processing in Comp. Ex. 1 DHF (100:1) at 25° C. for 20 seconds. These results indicate that the wet clean formulations of the present invention is compatible with etch-damaged porous low-k dielectrics.

TABLE 6

Patterned porous ILD PDEMS 2.5 compatibility

| Clean Formulations | Temp. (° C.) | Time (second) | CD change (µm) | CD change (%) |
|---|---|---|---|---|
| Comp. Ex. 1 DHF (100:1) | 25 | 20 | 0.21 | 21 |
| Ex. 2 AW21028-85G | 25 | 120 | 0.03 | 3 |

As can be seen from the above data, this invention discloses wet clean formulations which effectively prevent CoWP etch and CoWP/Cu galvanic corrosion, demonstrate proficient cleaning on Cu/low-k patterned with and without CoWP wafers and have minimal impact to porous low-k dielectrics.

The wet clean formulations may also include one or more of the following additives: corrosion inhibitors, O$_2$ scavengers, and other additives. The additive(s) may be added to the extent that they do and/or do not adversely affect the pH range of the composition. With corrosion inhibitor and/or O$_2$ scavenger additives, the molar ratio of amine and/or quaternary ammonium hydroxide to organic acid can be: (a) equal to, (b) greater, or (c) less than 1.

Examples of the compositions are:

EX. 10

AW21656-16D

| | |
|---|---|
| DI water | 53.45 wt % |
| Acetic acid | 1.05 wt % |
| TEA | 3.5 wt % |
| Glycerol | 40 wt % |
| Benzotriazole | 2 wt % |

EX. 11

AW21656-16E

| | |
|---|---|
| DI water | 54.45 wt % |
| Acetic acid | 1.05 wt % |
| TEA | 3.5 wt % |
| Glycerol | 40 wt % |
| Benzotriazole | 1 wt % |

EX. 12

AW21656-16F

| | |
|---|---|
| DI water | 54.95 wt % |
| Acetic acid | 1.05 wt % |
| TEA | 3.5 wt % |
| Glycerol | 40 wt % |
| Benzotriazole | 0.5 wt % |

EX. 13

AW21656-19A

| | |
|---|---|
| DI water | 55.35 wt % |
| Acetic acid | 1.05 wt % |
| TEA | 3.5 wt % |
| Glycerol | 40 wt % |
| Benzotriazole | 0.1 wt % |

EX. 14

AW21656-18A

| | |
|---|---|
| DI water | 54.95 wt % |
| Acetic acid | 1.05 wt % |
| TEA | 3.5 wt % |
| Glycerol | 40 wt % |
| Tolyltriazole | 0.5 wt % |

EX. 15

AW21656-19B

| | |
|---|---|
| DI water | 55.35 wt % |
| Acetic acid | 1.05 wt % |
| TEA | 3.5 wt % |
| Glycerol | 40 wt % |
| Tolyltriazole | 0.1 wt % |

EX. 16

AW21656-18G

| | |
|---|---|
| DI water | 53.45 wt % |
| Acetic acid | 1.05 wt % |
| TEA | 3.5 wt % |
| Glycerol | 40 wt % |
| 1,2,4-triazole | 2 wt % |

EX. 17

AW21656-18C

| | |
|---|---|
| DI water | 54.95 wt % |
| Acetic acid | 1.05 wt % |
| TEA | 3.5 wt % |
| Glycerol | 40 wt % |
| 1,2,4-triazole | 0.5 wt % |

EX. 18

AW21656-19C

| | |
|---|---|
| DI water | 55.35 wt % |
| Acetic acid | 1.05 wt % |
| TEA | 3.5 wt % |
| Glycerol | 40 wt % |
| 1,2,4-triazole | 0.1 wt % |

EX. 19

AW21656-19D

| | |
|---|---|
| DI Water | 50.45 wt % |
| Acetic acid | 1.05 wt % |
| TEA | 3.5 wt % |
| Glycerol | 40 wt % |
| Ascorbic acid | 5 wt % |

EX. 20

AW21656-18H

| | |
|---|---|
| DI water | 53.45 wt % |
| Acetic acid | 1.05 wt % |
| TEA | 3.5 wt % |
| Glycerol | 40 wt % |
| Ascorbic acid | 2 wt % |

EX. 21

AW21656-18D

| | |
|---|---|
| DI water | 54.95 wt % |
| Acetic acid | 1.05 wt % |
| TEA | 3.5 wt % |
| Glycerol | 40 wt % |
| Ascorbic acid | 0.5 wt % |

EX. 22

AW21656-18F

| | |
|---|---|
| DI water | 53.45 wt % |
| Acetic acid | 1.05 wt % |
| TEA | 3.5 wt % |
| Glycerol | 40 wt % |
| Carbohydrazide | 2 wt % |

EX. 23

AW21656-18B

| | |
|---|---|
| DI water | 54.95 wt % |
| Acetic acid | 1.05 wt % |
| TEA | 3.5 wt % |
| Glycerol | 40 wt % |
| Carbohydrazide | 0.5 wt % |

EX. 24

AW21656-16A

| | |
|---|---|
| DI water | 50.45 wt % |
| Acetic acid | 1.05 wt % |
| TEA | 3.5 wt % |
| Glycerol | 40 wt % |
| Catechol | 5 wt % |

EX. 25

AW21656-29A

| | |
|---|---|
| DI water | 64.91 wt % |
| Octanoic acid | 2 wt % |
| TEA | 2.59 wt % |
| Glycerol | 30 wt % |
| Ascorbic acid | 0.5 wt % |

EX. 26

AW21656-30D

| | |
|---|---|
| DI water | 56.9 wt % |
| Acetic acid | 1.05 wt % |
| TEA | 1.55 wt % |
| Glycerol | 40 wt % |
| Benzotriazole | 0.5 wt % |

EX. 27

AW21656-30E

| | |
|---|---|
| DI water | 55.86 wt % |
| Acetic acid | 1.05 wt % |
| TEA | 2.59 wt % |
| Glycerol | 40 wt % |
| Benzotriazole | 0.5 wt % |

EX. 28

AW21656-30H

| | |
|---|---|
| DI water | 56.9 wt % |
| Acetic acid | 1.05 wt % |
| TEA | 1.55 wt % |
| Glycerol | 40 wt % |
| Tolyltriazole | 0.5 wt % |

EX. 29

AW21656-301

| | |
|---|---|
| DI water | 55.86 wt % |
| Acetic acid | 1.05 wt % |
| TEA | 2.59 wt % |
| Glycerol | 40 wt % |
| Tolyltriazole | 0.5 wt % |

EX. 30

AW21656-30F

| | |
|---|---|
| DI water | 56.9 wt % |
| Acetic acid | 1.05 wt % |
| TEA | 1.55 wt % |
| Glycerol | 40 wt % |
| 1,2,4-triazole | 0.5 wt % |

EX. 31

AW21656-30G

| | |
|---|---|
| DI water | 55.86 wt % |
| Acetic acid | 1.05 wt % |
| TEA | 2.59 wt % |
| Glycerol | 40 wt % |
| 1,2,4-triazole | 0.5 wt % |

Preferred Ranges:

| | |
|---|---|
| DI water | 7-99.7 wt % |
| Organic acid | 0.2-5 wt % |
| Amine/quaternary ammonium hydroxide | 0.5-20 wt % |
| Solvent | 0-70 wt % |
| Corrosion inhibitor and/or O$_2$ scavenger | 0.01-10 wt % |
| Contact Time Interval | 0.1-5 min. |

Most Preferred Ranges:

| | |
|---|---|
| DI water | 7-99.7 wt % |
| Organic acid | 0.5-3 wt % |
| Amine/quaternary ammonium hydroxide | 1.5-10 wt % |
| Solvent | 25-55 wt % |
| Corrosion inhibitor and/or O$_2$ scavenger | 0.1-5 wt % |
| Contact Time Interval | 0.5-2 min. |

Exemplary Organic Corrosion Inhibitors and O$_2$ Scavengers:

The compositions of the present disclosure can also optionally contain up to about 10 wt %, or about 0.1 to about 5 wt % of a corrosion inhibitor and/or oxygen scavenger to further reduce the attack on the Cu, Co and CoWP. Examples of corrosion inhibitors may be a triazole, such as 1,2,4-triazole, or triazoles substituted with substituents such as C1-C8 alkyl, amino, thiol, mercapto, imino, carboxy and nitro groups, such as benzotriazole, 5-carboxylic acid benzotriazole, tolyltriazole, 5-phenyl-benzotriazole, 5-nitro-benzotriazole, 3-amino-5-mercapto-1,2,4-triazole, 1-amino-1,2,4-triazole, hydroxy-benzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiolbenzotriazole, naphthotriazole, and thiazoles, tetrazoles, imidazoles, phosphates, thiols and azines such as 2-mercaptobenzoimidazole, 2-mercapto-benzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, mercaptobenzothiazole, imidazoline thione, mercaptobenzoimidazole, 4-methyl-4H-1,2,4-triazole-3-thiol, 5-amino-1,3,4-thiadiazole-2-thiol, benzothiazole, tritolyl phosphate, indiazole, etc. Suitable corrosion inhibitors further include an organic acid, an organic acid salt, a phenol, a hydroxylamine or acid salt thereof. Examples of particular corrosion inhibitors include citric acid, anthranilic acid, salicylic acid, lactic acid, iminodiacetic acid, benzoic acid, isophthalic acid, maleic acid, fumaric acid, D,L-malic acid, malonic acid, phthalic acid, maleic anhydride, phthalic anhydride, resorcinol, diethyl hydroxylamine and the lactic acid and citric acid salts thereof, and the like. Yet other examples of suitable corrosion inhibitors include fructose, ammonium thiosulfate, glycine, tetramethylguanidine, benzoguanamine, melamine, guanine, adenine, thioglycerol, salicylamide, and dimethylacetoacetamide. In embodiments wherein the corrosion inhibitor is an organic acid, the organic acid may be the same as that used in the solution.

Exemplary oxygen scavengers include ascorbic acid, catechol, carbohydrazide, gallic acid, hydroquinone, pyrogallol, cyclohexanedione, hydrazine, a sulfite, a bisulfate, and/or a nitrilte.

The composition may also include one or more of the following additives: surfactants, chelating agents, chemical modifiers, dyes, biocides, and other additives. The additive(s) may be added to the extent that they do not adversely affect the pH range of the composition. Some examples of representative additives include acetylenics alcohols and derivatives thereof, acetylenics diols (non-ionic alkoxylated and/or self-emulsifiable acetylenics diol surfactants) and derivatives thereof, alcohols, quaternary amines and di-amines, amides (including aprotic solvents such as dimethyl formamide and dimethyl acetamide), alkyl alkanolamines (such as diethanolethylamine), and chelating agents such as beta-diketones, beta-ketoimines, carboxylic acids, malic acid and tartaric acid based esters and diesters and derivatives thereof, and tertiary amines, diamines and triamines. Specific acetylenic diols include Surfynol 465 surfactant available from Air Products and Chemicals, Inc., Allentown, Pa., USA. Surfynol 465 is 2,4,7,9-tetramethyl-5-decyn-4,7-diol, which is ethoxylated with 10 ethylene oxide units. See U.S. Pat. No. 6,717,019 at column 9, line 46.

COMPARATIVE EXAMPLES

Comparative Ex. 3

AW21656-30B

| | |
|---|---|
| DI water | 57.40 wt % |
| Acetic acid | 1.05 wt % |
| TEA | 1.55 wt % |
| Glycerol | 40 wt % |

Comparative Ex. 4

AW21656-30C

| | |
|---|---|
| DI water | 56.36 wt % |
| Acetic acid | 1.05 wt % |
| TEA | 2.59 wt % |
| Glycerol | 40 wt % |

Table 7 and 8 summarize the metal etch rate data of wet clean formulations with additional corrosion inhibitors and/or $O_2$ scavengers. The corrosion inhibitor and/or $O_2$ scavenger, and/or combination of two or more corrosion inhibitor and/or $O_2$ scavenger are useful to improve the compatibility of the composition with the metals at pH>7 or pH<7.

TABLE 7

Etch rate data on blanket Co, CoWP and Cu wafers

| Clean Formulations | Corrosion inhibitors/ $O_2$ scavengers (wt %) | pH | Co etch rate (Å/min) | CoWP etch rate (Å/min) | Cu etch rate (Å/min) |
|---|---|---|---|---|---|
| Ex. 10 AW21656-16D | Benzotriazole (2) | 7.13 | 2 | <1 | <1 |
| Ex. 11 AW21656-16E | Benzotriazole (1) | 7.26 | 3 | <1 | <1 |
| Ex. 12 AW21656-16F | Benzotriazole (0.5) | 7.24 | 2 | <1 | <1 |
| Ex. 13 AW21656-19A | Benzotriazole (0.1) | 7.33 | 2 | <1 | <1 |
| Ex. 14 AW21656-18A | Tolyltriazole (0.5) | 7.33 | 2 | <1 | <1 |
| Ex. 15 AW21656-19B | Tolyltriazole 0.1 | 7.35 | 4 | <1 | 1 |
| Ex. 16 AW21656-18G | 1,2,4-triazole (2) | 7.36 | 4 | <1 | 1 |
| Ex. 17 AW21656-18C | 1,2,4-triazole (0.5) | 7.43 | 4 | <1 | <1 |
| Ex. 18 AW21656-19C | 1,2,4-triazole (0.1) | 7.50 | 8 | <1 | 1 |
| Ex. 19 AW21656-19D | Ascorbic acid (5) | 4.47 | 10 | <1 | 3 |
| Ex. 20 AW21656-18H | Ascorbic acid (2) | 5.22 | 12 | 1.1 | 2 |
| Ex. 21 AW21656-18D | Ascorbic acid (0.5) | 7.15 | 5 | 1.2 | 1 |
| Ex. 22 AW21656-18F | Carbohydrazide (2) | 7.42 | 11 | 2.2 | 7 |
| Ex. 23 AW21656-18B | Carbohydrazide (0.5) | 7.45 | 14 | 1.5 | 6 |
| Ex. 24 AW21656-16A | Catechol (5) | 7.42 | 2 | 1.8 | 5 |
| Ex. 25 AW21028-29A | Ascorbic acid (0.5) | 6.44 | 8 | 1.3 | 3 |

TABLE 8

Etch rate data on blanket Co, CoWP and Cu wafers

| Clean Formulations | Corrosion inhibitors/ $O_2$ scavenger (wt %) | pH | Co etch rate (Å/min) | CoWP etch rate (Å/min) | Cu etch rate (Å/min) |
|---|---|---|---|---|---|
| Comp. Ex. 3 AW21028-30B | none | 4.89 | 199 | 4.3 | 6 |
| Comp. Ex. 4 AW21656-30C | none | 6.19 | >1011 | 3.2 | 5 |
| Ex. 26 AW21656-30D | Benzotriazole (0.5) | 4.88 | 33 | <1 | <1 |
| Ex. 27 AW21656-30E | Benzotriazole (0.5) | 6.15 | 3 | <1 | <1 |
| Ex. 28 AW21656-30H | Tolyltriazole (0.5) | 4.93 | 10 | <1 | 1 |
| Ex. 29 AW21656-30I | Tolyltriazole (0.5) | 6.15 | 2 | <1 | <1 |
| Ex. 30 AW21656-30F | 1,2,4-triazole (0.5) | 4.84 | 16 | 1.6 | 14 |
| Ex. 31 AW21656-30G | 1,2,4-triazole (0.5) | 6.12 | 7 | 1.3 | <1 |

The invention claimed is:

1. A non-fluoride wet clean formulation for removal of post etch and ash residue from a Cu/low-k patterned semiconductor substrate having a CoWP feature, consisting essentially of;
   Deionized water;
   An acid selected from the group consisting of Acetic acid, Octanoic acid and mixtures thereof;
   Amine selected from the group consisting of triethanol amine and N-methyl monoethanol amine;
   Glycerol;
   optionally a corrosion inhibitor;
   wherein the formulation is compatible with the Cu/low-k pattern and the CoWP feature and (a) the molar ratio of amine to organic acid provides an approximately 4.47 to 7.50 pH and (b) the formulation has an acid content greater than 0.84 wt % and equal to or less than 2.0wt %.

2. A process for wet clean removal of post etch and ash residue from a Cu/low-K patterned semiconductor substrate having a CoWP feature, comprising;
   roviding a semiconductor substrate having a CoWP feature;
   contacting the substrate with a wet clean formulation consisting essentially of:
   deionized water;
   an acid selected from the group consisting of acetic acid, octanoic acid and mixtures thereof;
   amine selected from the group consisting of triethanol amine and N-methyl monoethanol amine;
   glycerol;
   optionally a corrosion inhibitor;
   wherein the formulation is compatible with the Cu/low-K pattern and the CoWP feature and (a) the molar ratio of amine to organic acid provides an approximately 4.47 to 7.5 pH and (b) the formulation has an acid content greater than 0.84 wt % and equal to or less than 2.0wt %.

3. The process of claim 2 wherein the CoWP feature is adjacent a copper metal feature.

4. The process of claim 2 wherein the substrate includes a porous low dielectric feature.

5. The process of claim 2 wherein the temperature during the contact is in the range of 20 to 45° C.

6. The process of claim 2 wherein the contact is conducted for a time interval in the range of 0.1 to 5 minutes.

7. The formulation of claim 1 wherein the corrosion inhibitor is included and is selected from the group consisting of benzotriazole, tolyltriazole and mixtures thereof.

8. The process of claim 2 wherein the corrosion inhibitor is included in said formulation and is selected from the group consisting of benzotriazole, tolyltriazole and mixtures thereof.

9. The process of claim 8 wherein the temperature during the contact is in the range of 20 to 45° C.

10. The process of claim 8 wherein the contact is conducted for a time interval in the range of 0.1 to 5 minutes.

11. The process of claim 9 wherein the contact is conducted for a time interval in the range of 0.1 to 5 minutes.

* * * * *